United States Patent [19]

Imel

[11] Patent Number: 4,816,700
[45] Date of Patent: Mar. 28, 1989

[54] TWO-PHASE NON-OVERLAPPING CLOCK GENERATOR

[75] Inventor: Michael T. Imel, Beaverton, Oreg.

[73] Assignee: Intel Corporation, Santa Clara, Calif.

[21] Appl. No.: 133,325

[22] Filed: Dec. 16, 1987

[51] Int. Cl.$^4$ .......................... H03K 5/13; H03K 19/00
[52] U.S. Cl. ..................................... 307/269; 307/262; 307/480
[58] Field of Search ....................... 307/262, 269, 480; 328/133

[56] References Cited

U.S. PATENT DOCUMENTS

| | | | |
|---|---|---|---|
| 3,596,188 | 7/1971 | Hasse | 307/269 |
| 3,961,269 | 6/1976 | Alvarez, Jr. | 307/262 |
| 4,417,158 | 11/1983 | Ito et al. | 307/269 |
| 4,587,441 | 5/1986 | Torelli et al. | 307/269 |
| 4,686,386 | 8/1987 | Tadao | 307/480 |

*Primary Examiner*—Stanley D. Miller
*Assistant Examiner*—Richard Roseen
*Attorney, Agent, or Firm*—Owen L. Lamb

[57] ABSTRACT

An external timing source (40) provides an input waveform (44, 46) of signal voltage transitions which occur at a first frequency, which is twice the frequency desired by the internal clock. A divider circuit (48) divides the input waveform (44, 46) into a pair of intermediate waveforms (60, 62). The intermediate waveforms have signal-voltage transitions of opposing polarity which occur at a second frequency that is one-half of the first frequency. The input waveforms and the intermediate waveforms are supplied to a driver circuit (64). The driver circuit utilizes the intermediate waveforms occurring at the divided-down frequency and the input waveform occurring at the system clock frequency to produce a pair of final waveforms (66, 68). The final waveforms have signal voltage transistions of opposing polarity occurring at the divided-down frequency, but triggerred by and in synchronism with the input waveform occurring at the external clock frequency.

1 Claim, 3 Drawing Sheets

TWO-PHASE NON-OVERLAPPING CLOCK GENERATOR

TECHNICAL FIELD

This invention relates to integrated logic circuits, and more particularly, to a pipelined, symmetric, two-phase non-overlapping clock generator.

BACKGROUND ART

CMOS/NMOS-clocked chip designs use two or more symmetric non-overlapping clock phases to perform a given logic function. This type of clock is used in the Intel 80286 and 80386 microprocessors. Four clocks, PH1, PH1I, PH2, PH2I are distributed in the chip. PH1 and PH2 are traditional NMOS nonoverlapping clocks with equal duty cycles. PH1I and PH2I are the PMOS analogs to PH1 and PH2 and are exactly inversions of PH1 and PH2, respectively. Successive PH1 and PH2 assertions form a microcycle that is 62.5 nanoseconds when the chip is operated at 16-MHz frequency.

In the prior art, the method of generating two nonoverlapped clocks is for the user system to provide an input clock frequency that is exactly twice the frequency of the desired internal clock frequency. Thus, to generate an internal PH1 and PH2 clock frequency of 20 MHz, a 40-MHz-external-clock frequency is applied as input to the chip. This input frequency is then divided by a factor of two to generate a 20-MHz, 50% duty-cycle clock that is used as an input to a waveshaping circuit which generates two symmetric nonoverlapping clocks.

A typical two-phase, symmetric, nonoverlapped clock generator is shown in FIG. 1. The clock input (10) is provided to a level shifter and clock buffer (12). The output (14) of the buffer is provided to a divide-by-two circuit (16), which divides the frequency of clock (10) down to a positive-going clock level (18), and a negative-going clock level (20). These clock levels are input to a clock driver waveshaper and buffer (22) that generates the PH1 and PH2 clock lines (24, 26) and the inversions of these lines PH1I and PH2I (28, 30) from the clock levels (18, 20).

This method of generating two symmetric non-overlapping clocks is preferable to having users externally supply to the chip the two non-overlapping to be buffered or used by the chip directly. This is because it is very difficult to generate symmetric, non-overlapping clocks externally. Board impedance, board signal routing, and clock-chip driving variability combine to make externally generated non-overlapping clocks not very cost effective.

The prior art circuit of FIG. 1 has a major disadvantage. A large clock skew, that is clock delay, from the transistion of the external clock input (10) to the generated transitions of the internal PH1 and PH2 clocks (66, 68) occurs due to the buffering and intermediate logic, notably the divide-by-two circuit that is in the critical path to generating PH1 and PH2. This clock delay between the internally generated clock and the external system clock makes it difficult to synchronize logic chip outputs that are activated by using the internal PH1, PH2 clocks, with the external system clock.

It is an object of the present invention to provide an improved symmetric, non-overlapping clock generator that minimizes the time delay between the external system clock and the internally generated clock signals.

DISCLOSURE OF THE INVENTION

The above object is accomplished in accordance with the invention as follows. An external timing source provides input waveforms of signal voltage transitions which occur at a first frequency, which is twice the frequency desired by the internal clock. A divider circuit divides the input waveforms into a pair of intermediate waveforms. The intermediate waveforms have signal-voltage transistions of opposing polarity which occur at a second frequency that is one-half of the first frequency.

The input waveform and the intermediate waveforms are supplied to a driver circuit. The driver circuit utilizes the intermediate waveforms occurring at the divided-down frequency and the input waveform occurring at the system clock frequency to produce a pair of final waveforms. The final waveforms have signal voltage transitions of opposing polarity occurring at the divided-down frequency, but triggerred by and in synchronism with the input waveform occurring at the external clock frequency.

This clock generator has the advantage of removing the divide-by-two circuit from the speed critical path by utilizing the system-clock input directly to synchronize the final clock output.

BRIEF DESCRIPTION OF DRAWINGS

The foregoing and other objects, features, and advantages of the invention will be apparent from the following detailed description of a preferred embodiment of the invention as illustrated in the accompanying drawings wherein.

BEST MODE FOR CARRYING OUT THE INVENTION

Symmetric, non-overlapping clock waveforms are defined as follows.

Let PHN represent n internal unique clock waveforms. Further, let [PH (n+1) modulo n] be defined as the next successive phase initiation time that is asserted after deassertion of PHN. Then, all PHN on a single chip are considered to be symmetric if, and only if, the following three conditions hold within reasonable engineering tolerances, less than 10%:

1. No two PHN can simultaneously be at nonzero volts.

2. All PHN must be asserted (5 volts for current NMOS type of phases) for equal duration within all clock cycles.
3. Nonoverlap time (the time between deassertion of each PHN and the assertion of the next closest phase in time [PH (n+1) modulo n], must be equal between each successive phase.

Figure 1:
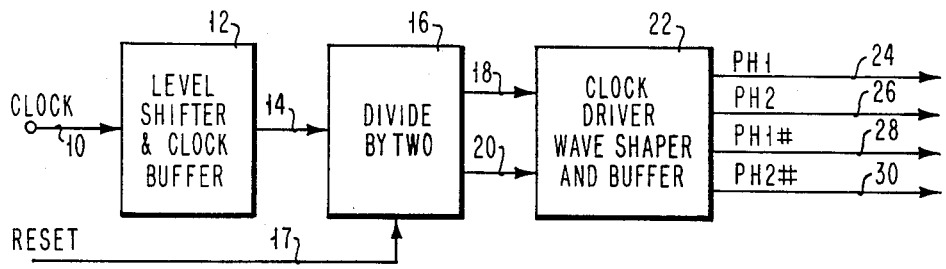
FIG. 1 is a schematic diagram of a prior art clock generator.
Figure 2:
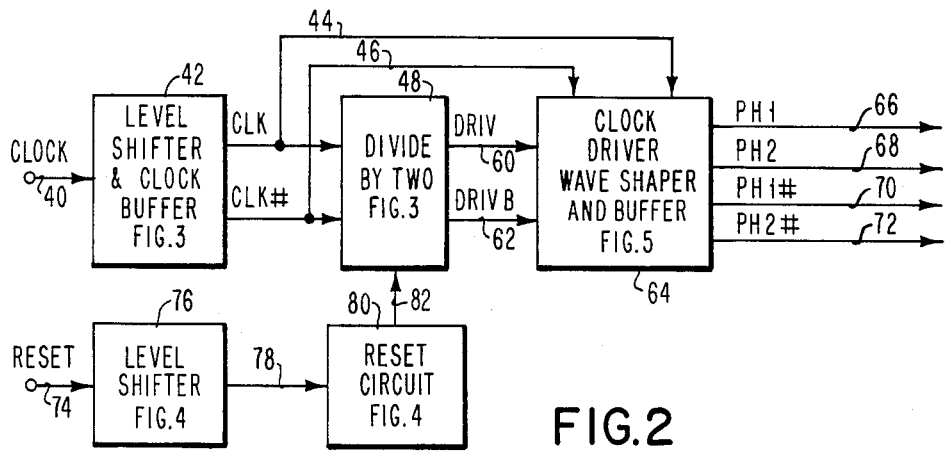
FIG. 2 is a schematic diagram of a clock generator in which the present invention is embodied.

A simplified block diagram of a clock generator in which the present invention is embodied is shown in FIG. 2. An external system-clock input (40), which operates at twice the desired frequency of the clock, is supplied to level shifter and clock buffer (42). This produces a pair of input waveforms (44, 46), which are supplied to the divide-by-two circuit (48). The input waveshaper and buffer (64).

The divide-by-two circuit (48) divides the input waveforms (44, 46) into a pair of intermediate waveforms (60, 62) of signal-voltage transitions of opposing polarity occurring at a second frequency that is one-half of the input frequency. These intermediate waveforms are supplied to the clock driver waveshaper and buffer (64). The clockdriver (64) utilizes the intermediate waveforms occurring at the divided-down frequency and the input waveform occurring at the system-clock frequency to produce a pair of final waveforms (66, 68) of signal-voltage transitions of opposing polarity occurring at the divided-down frequency, the PH2 and PH1 clocks. These final waveforms are, however, synchronized and triggered by the input waveforms (44, 46) occurring at the input frequency. This circuit effectively removes the divide-by-two circuit (48) from the critical path and passes the input clock directly into the clock driver waveshaping and buffer circuitry 64 to synchronize the PH1 and PH2 output clocks.

Figure 3:
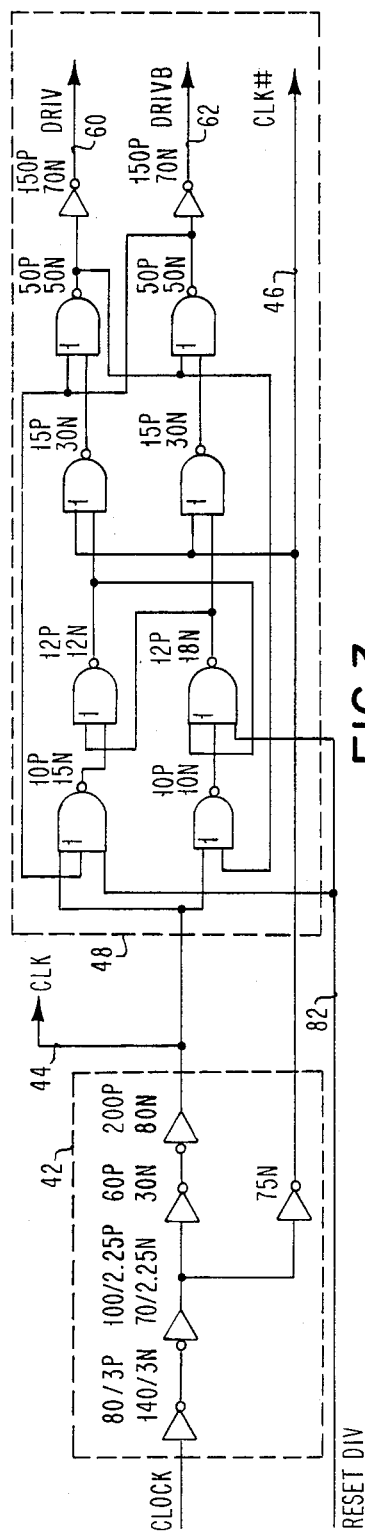
FIG. 3 is a more detailed schematic diagram of the level shifter and clock buffer (42) and the divide by two circuit (48) shown in FIG. 2.

The detailed logic within the blocks (42, 48) shown in FIG. 2 is shown in more detail in FIG. 3.

Figure 4:
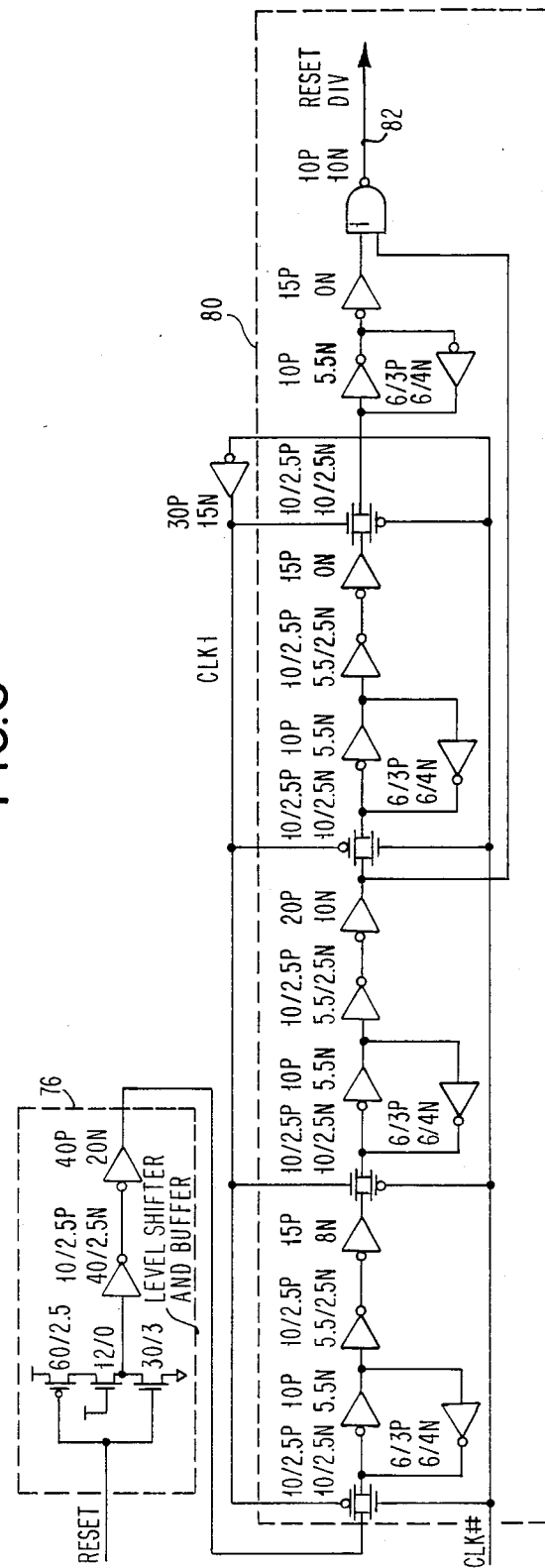
FIG. 4 is a more detailed logic diagram of the level shifter (76) and reset circuit (80) shown in FIG. 2.

The level shifter and buffer (76) and the reset circuit (80) are shown in more detail in FIG. 4.

Figure 5:
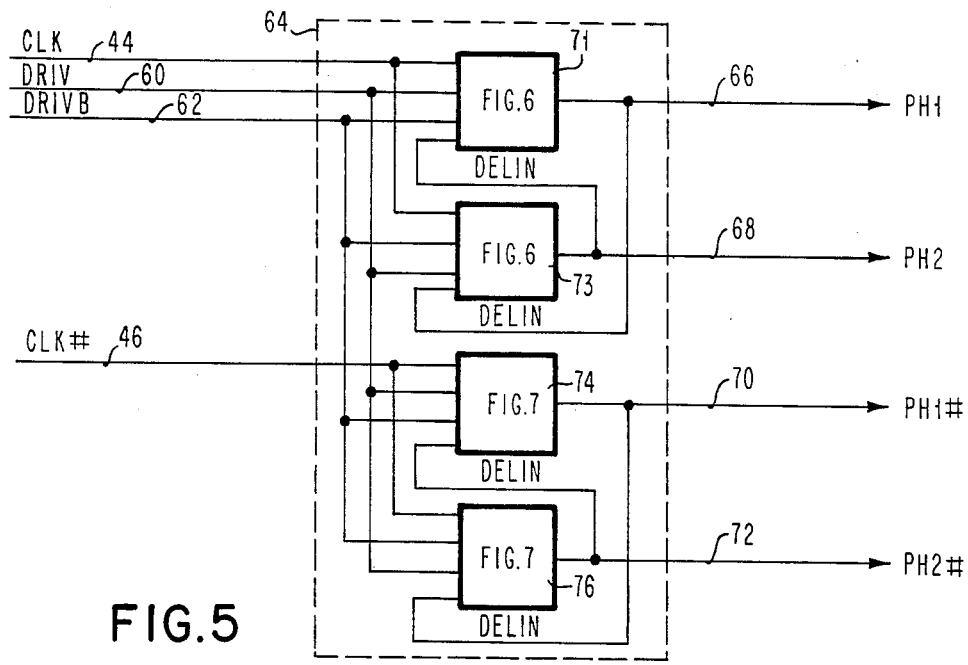
FIG. 5 is a more detailed logic diagram of the clock buffer, driver, wave shaper and buffer (64) of FIG. 2.

The clock driver waveshaper and buffer (64) is shown in more detail in FIG. 5.

Figure 6:
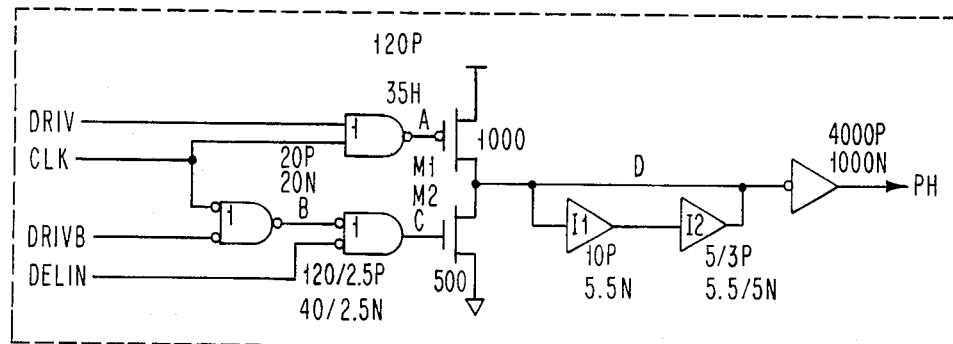
FIG. 6 is a more detailed logic diagram of blocks (71, 73) of FIG. 5.
Figure 7:
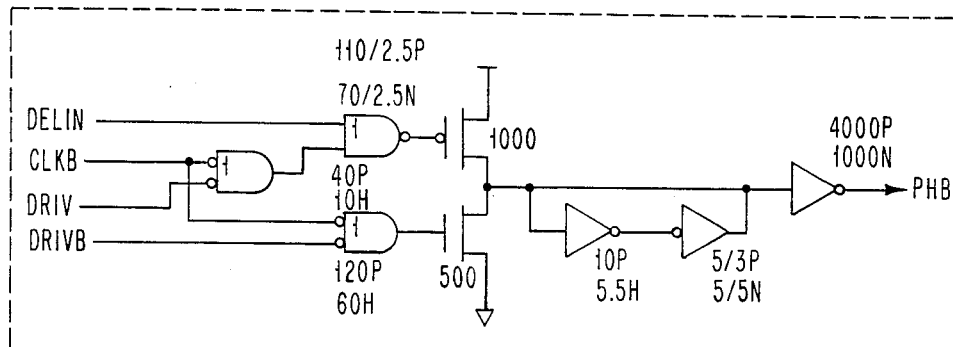
FIG. 7 is a more detailed logic diagram of blocks (74, 76) of FIG. 5.

Referring now to FIG. 5, the PH1 and PH2 clock lines are derived from identical circuits (71, 73), Shown in detail in FIG. 6, which each receive the PH output from the other circuit as the DELIN input. The inversions of PH1 and PH2 are generated by identical circuits (74, 76), shown in detail in FIG. 7 which are also cross-coupled.

Figure 8:
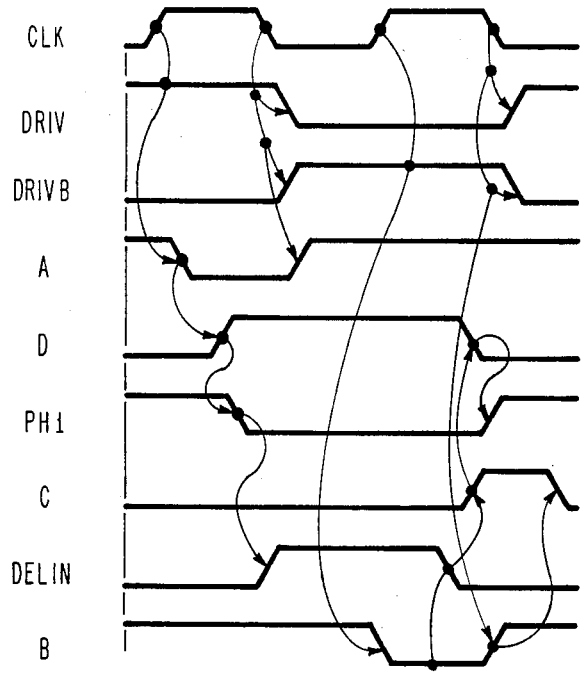
FIG. 8 is a timing diagram of the clock generator shown in FIGS. 2 and 3.

The circuit of FIG. 6 will now be described with reference to the timing diagram shown in FIG. 8. In FIG. 8, the waveshapes labeled A, B, C, and D refer to the nodes which are similarly labeled in FIG. 6. The CLK waveshape is provided by an external clock input which is twice the frequency of the PH1 and PH2 outputs. The CLK signal supplied to the divide-by-two circuit (48) results in intermediate waveforms (60, 62), which are labeled DRIV and DRIVB. DRIV and DRIVB change level at each negative-going transition of CLK.

Node A is dependent upon the CLK line and switches from a high to low when the CLK line rises. Node A does not depend on the divided-down signal. DRIV, changing level. As Node A switches from high to low, it causes Node D to switch from low to high through the transistor $M_1$. Node D, going high, causes the PH1 output to go negative. Node A returns to a high when CLK goes low. It stays high until it is used to trigger the next PH1 falling transition.

Node B will stay high until both the CLK and DRIVB are high, then Node B will switch to low. This sets up Node C to go high upon the condition that DELIN (the PH2 output from Block 73) goes low. The PH2 output will go low in the same way that PH1 went low as companion block (73) has its own nodes A, B, C, and D. Node C going high will cause Node D to go low, which in turn causes PH1 to go high. This chain of events ensures the non-overlapping condition of PH1 and PH2.

In FIG. 6, the invertor I2 can only source about one milliamp of current, short-circuited, whereas the transistors $M_1$ and $M_2$ can supply about 100 milliamps of current. So, if either one of $M_1$ or $M_2$ turns on, it will overpower the influence of the invertors $I_1$ and $I_2$ on the state of Node D. Once $M_1$ and $M_2$ turn off, the $I_2$ invertor will be stronger than the leakage currents on $M_1$ and $M_2$, so $I_2$ will be able to hold the state of Node D, whatever that state may be. For example, if $M_1$ drives Node D to a high state by overriding the influence of $I_2$, and then when $M_1$ is turned off, leaving Node D in a high impedance state, then invertor $I_2$ will be sympathetic to the high state of Node D. Now, when $M_1$ is turned off, $I_2$ continues to drive a high onto Node D. Leakage current through $M_1$ is not enough to override the influence of invertor $I_2$. If there were no leakages in the transistors $M_1$ and $M_2$, the invertors $I_1$ and $I_2$ would not be necessary.

While the invention has been particularly shown and described with reference to preferred embodiments thereof, it will be understood by those skilled in the art that the foregoing and other changes in form and detail may be made therein without departing from the scope of the invention.

What is claimed is:
1. A clock signal generator comprising:
a clock buffer for providing a first input waveform of first signal voltage transitions occurring at a first frequency and a second input waveform of second signal voltage transitions of polarity opposite to the polarity of said first signal voltage transitions, said second signal voltage transitions occurring at said first frequency;
frequency divider means connected to said buffer;
said frequency divider means including first means for dividing said first waveform into a first intermediate waveform of second signal voltage transitions occurring at a second frequency which is a fraction of said first frequency and second means for dividing said second waveform into a second intermediate waveform of second signal voltage transitions occurring at said second frequency and,
driver means connected to said clock buffer and to said frequency divider means,
said driver means including first circuit means and second circuit means for utilizing said first and second intermediate waveforms occurring at said second frequency and said first and second input waveforms occurring at said first frequency to produce a pair of final waveform outputs of signal voltage transitions of opposing polarity occurring at said second frequency,
said first circuit means receiving as an input one of said final waveform output, said first circuit means further including means responsive to other said final waveform outputs (68) for causing said output to change to one level upon the condition that said DELIN input goes to the opposite level, said second circuit means receiving as an input other said final waveform outputs, said second circuit means further including means responsive to one of said final waveform outputs for causing said output to change to one level upon the condition that said DELIN output goes to the opposite level, thereby ensuring that said final waveforms do not overlap one another, each of said first and second circuit means further including means responsive to said input waveform for synchronizing said final waveforms with said first and second signal voltage transitions occurring at said first frequency.

* * * * *

UNITED STATES PATENT AND TRADEMARK OFFICE
CERTIFICATE OF CORRECTION

PATENT NO. : 4,816,700
DATED : Mar. 28, 1989
INVENTOR(S) : Michael T. Imel

Page 1 of 2

It is certified that error appears in the above-identified patent and that said Letters Patent is hereby corrected as shown below:

Column 4, line 37, after "buffer " insert --(42)--;
Column 4, line 37, after "first input waveform " insert --(44)--;
Column 4, line 39, after "second input waveform " insert --(46)--;
Column 4, line 44, after "divider means" insert --(48)--;
Column 4, line 44, after "buffer " insert --(42)--;
Column 4, line 46, after "first waveform " insert --(44)--;
Column 4, line 47, after "waveform" insert --(60)--;
Column 4, line 50, after "second waveform" insert --(46)--;
Column 4, line 51, after "waveform" insert --(62)--;
Column 4, line 53, after "driver means" insert --(64)--;
Column 4, line 53, after "clock buffer" insert --(42)--;
Column 4, line 54, after "divider means" insert --(48)--;
Column 4, line 55, after "driver means" insert --(64)--;
Column 4, line 55, after "first circuit means" insert --(71)--;
Column 4, line 56, after "second circuit means" insert --(73)--;
Column 4, line 57, after "intermediate waveforms" insert --(60; 62)--;
Column 4, line 59, after "waveforms" insert --(44; 46)--;
Column 4, line 60, after "waveform outputs" insert --(66; 68)--;
Column 4, line 62, change "frequency." to --frequency,--;
Column 4, line 64, change "output" to --outputs (66; 68)--;
Column 4, line 65, change "other said" to --said one--;
Column 4, line 66, change "outputs (68)" to --output (68)--;
Column 4, line 66, after "said output" insert --(66)--;
Column 4, line 68, change "DELIN input" to --input (68),--;
Column 5, line 1, after "second circuit means" insert --(73)--;
Column 5, line 1, change "other" to --the other one (66) of--;
Column 5, line 3, after "final waveform outputs" insert --(66; 68)--;
Column 5, line 4, delete "one of";
Column 5, line 6, change "said final waveform outputs for causing said output" to
--said other final waveform output (66) for causing said output (68)--;
Column 5, line 8, change "DELIN output" to --other output (66),--;
Column 6, line 1, after "final waveforms" insert --(66; 68)--;
Column 6, line 4, after "input waveform" insert --(44)--;

UNITED STATES PATENT AND TRADEMARK OFFICE
CERTIFICATE OF CORRECTION

PATENT NO. : 4,816,700

DATED : March 28, 1989

INVENTOR(S) : Michael T. Imel

It is certified that error appears in the above-identified patent and that said Letters Patent is hereby corrected as shown below:

Column 6, line 5, after "final Waveforms insert --(66;68)--.

Signed and Sealed this

Thirteenth Day of March, 1990

Attest:

JEFFREY M. SAMUELS

Attesting Officer

Acting Commissioner of Patents and Trademarks